United States Patent
Chuah et al.

(10) Patent No.: US 9,913,406 B2
(45) Date of Patent: Mar. 6, 2018

(54) SYSTEM AND METHOD FOR CONTROLLING AMBIENT TEMPERATURE AT A POWER-CONSUMING SITE

(71) Applicant: General Electric Company, Schenectady, NY (US)

(72) Inventors: Christopher James Chuah, Clifton Park, NY (US); Mark Edward Gotobed, Burnt Hills, NY (US); Shanon Kolasienski, Glens Falls, NY (US); Scot Sakolish, Valatie, NY (US)

(73) Assignee: General Electric Company, Schenectady, NY (US)

( * ) Notice: Subject to any disclaimer, the term of this patent is extended or adjusted under 35 U.S.C. 154(b) by 653 days.

(21) Appl. No.: 14/447,968

(22) Filed: Jul. 31, 2014

(65) Prior Publication Data
US 2016/0033178 A1   Feb. 4, 2016

(51) Int. Cl.
*F25B 27/00* (2006.01)
*H05K 7/20* (2006.01)

(52) U.S. Cl.
CPC .................................. *H05K 7/207* (2013.01)

(58) Field of Classification Search
CPC .............................. H05K 7/207; H04B 1/036
See application file for complete search history.

(56) References Cited

U.S. PATENT DOCUMENTS

| | | | | |
|---|---|---|---|---|
| 5,410,949 A | * | 5/1995 | Yung | A21B 7/005 366/146 |
| 6,283,628 B1 | * | 9/2001 | Goodwin | G01K 15/00 374/1 |
| 2007/0257642 A1 | * | 11/2007 | Xiao | H02J 7/0026 320/134 |
| 2012/0025620 A1 | * | 2/2012 | Stump | H02J 9/08 307/80 |
| 2013/0099720 A1 | | 4/2013 | Chuah et al. | |

* cited by examiner

*Primary Examiner* — Orlando E Aviles Bosques
(74) *Attorney, Agent, or Firm* — Dority & Manning, P.A.

(57) ABSTRACT

A system and method for controlling ambient temperature at a power-consuming site includes a hybrid generator-battery power system. The generator-battery power system includes an engine-generator set and one or more DC-powered batteries that alternately share the site load. Thus, the method includes providing one or more temperature sensors communicatively coupled to a battery management system at the power-consuming site. Another step includes monitoring the ambient temperature of the power-consuming site via the one or more temperature sensors when one or more of the DC-powered batteries are discharging (i.e. when the engine-generator set is off). The method also includes sending, via the battery management system, a start-up command to the engine-generator set when the ambient temperature of the power-consuming site reaches a threshold temperature such that the engine-generator set can provide AC power to an air conditioning unit at the power-consuming site.

16 Claims, 4 Drawing Sheets

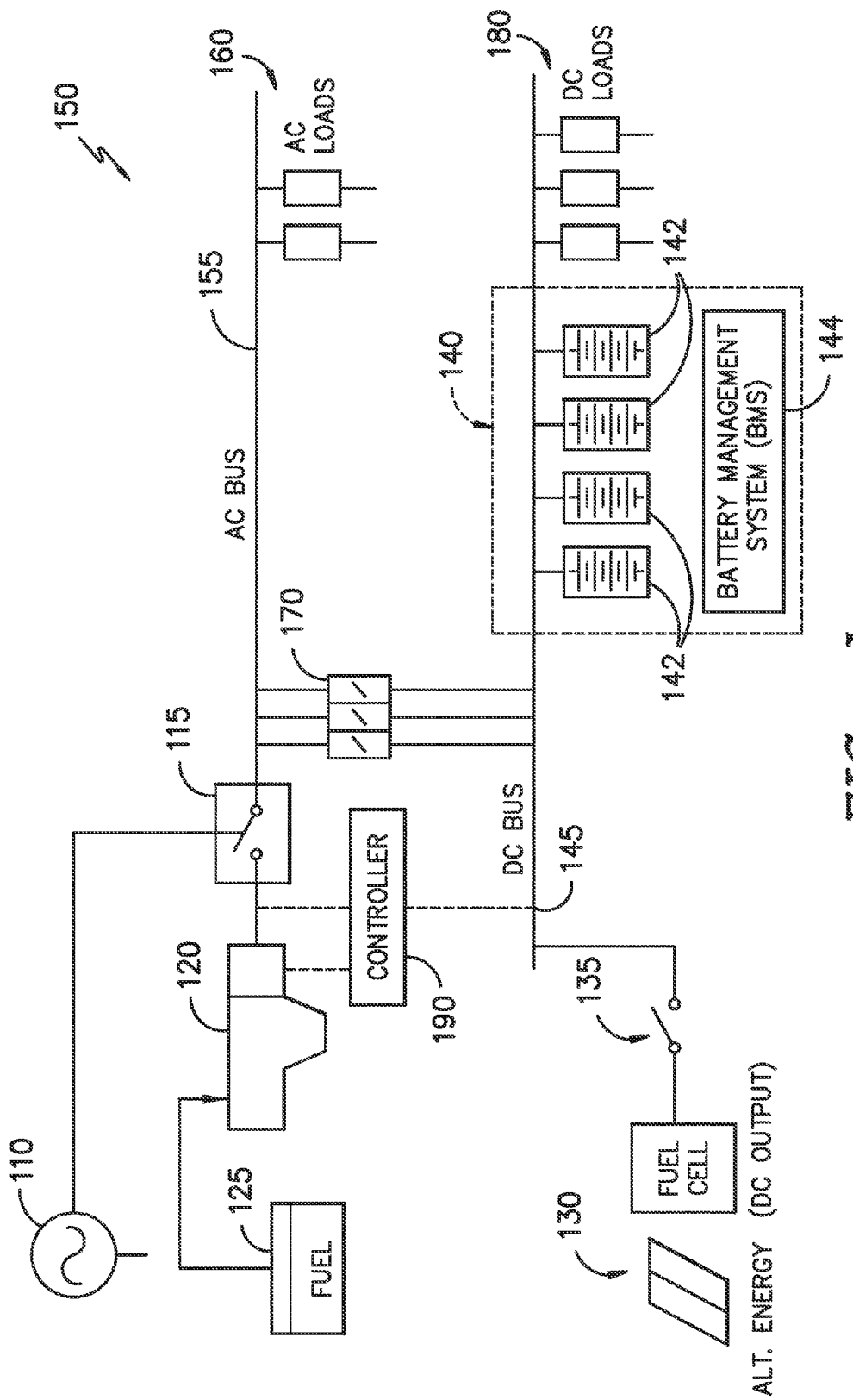
FIG. -1-

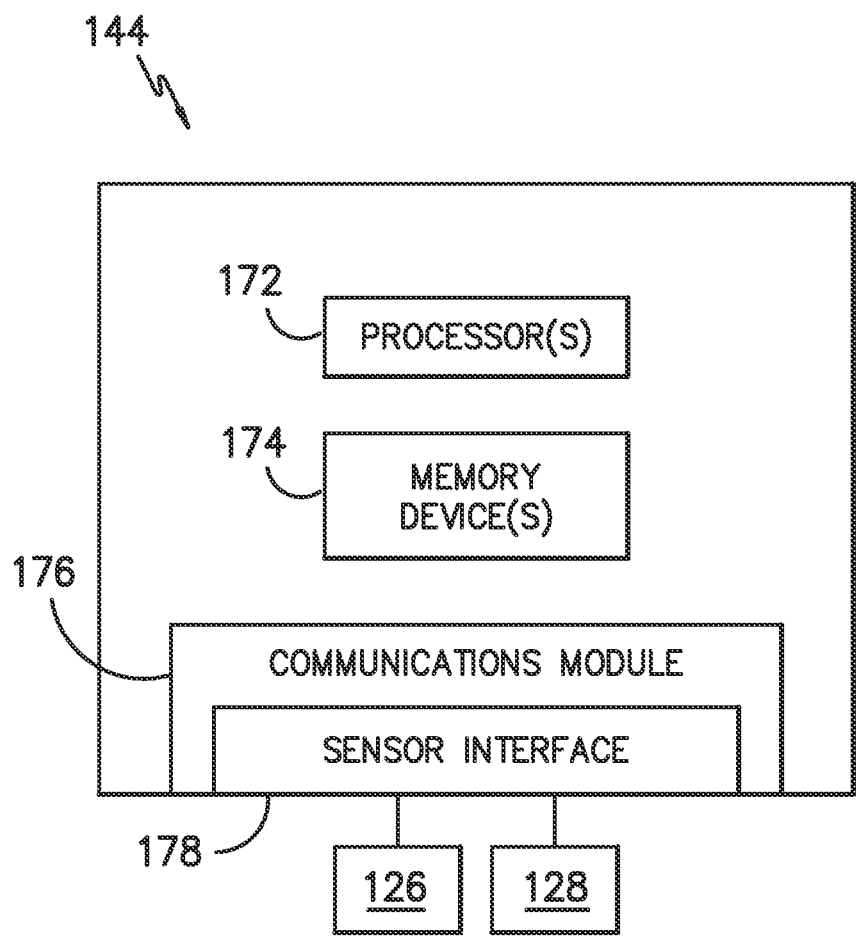
FIG. -2-

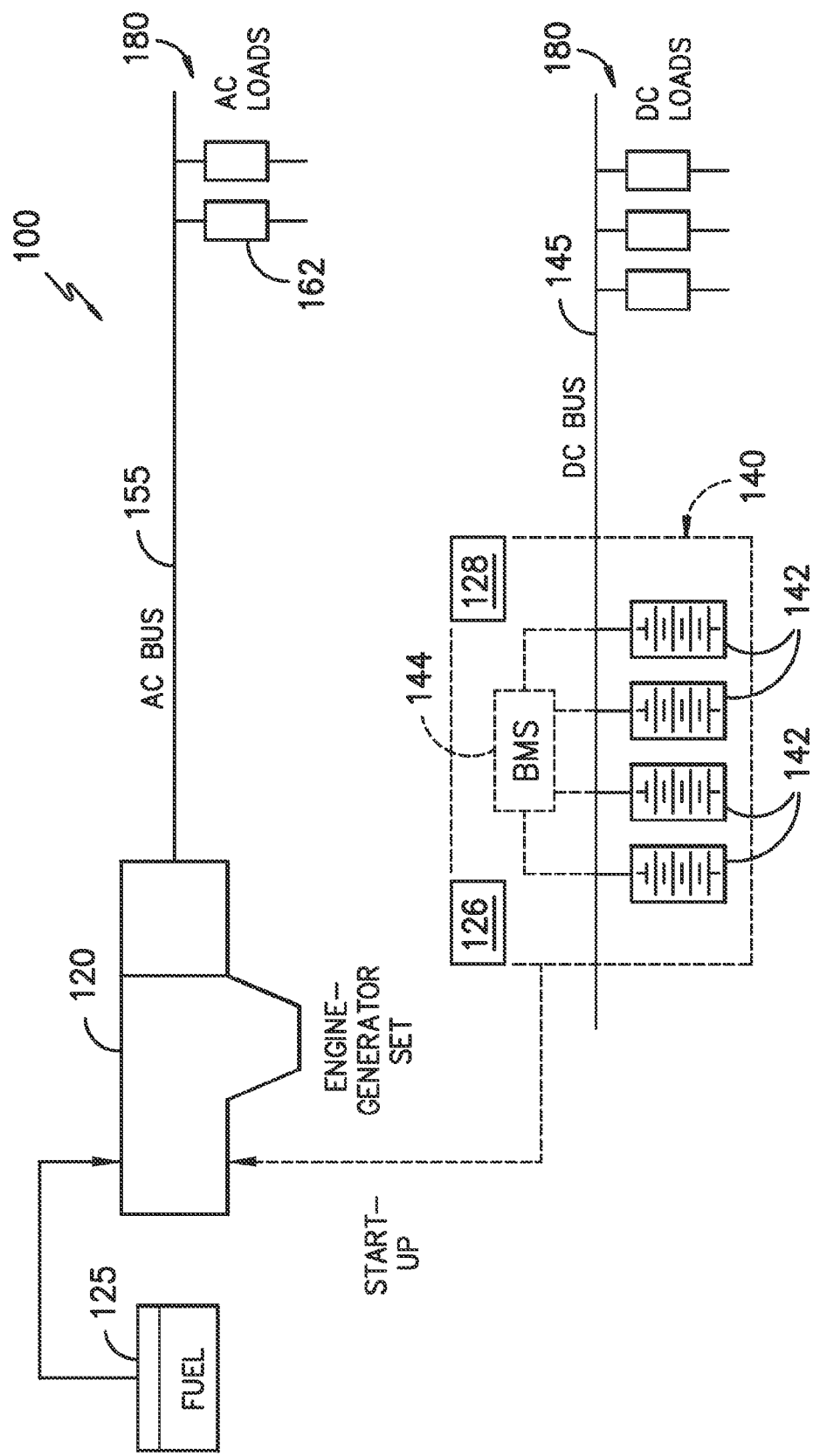
FIG. -3-

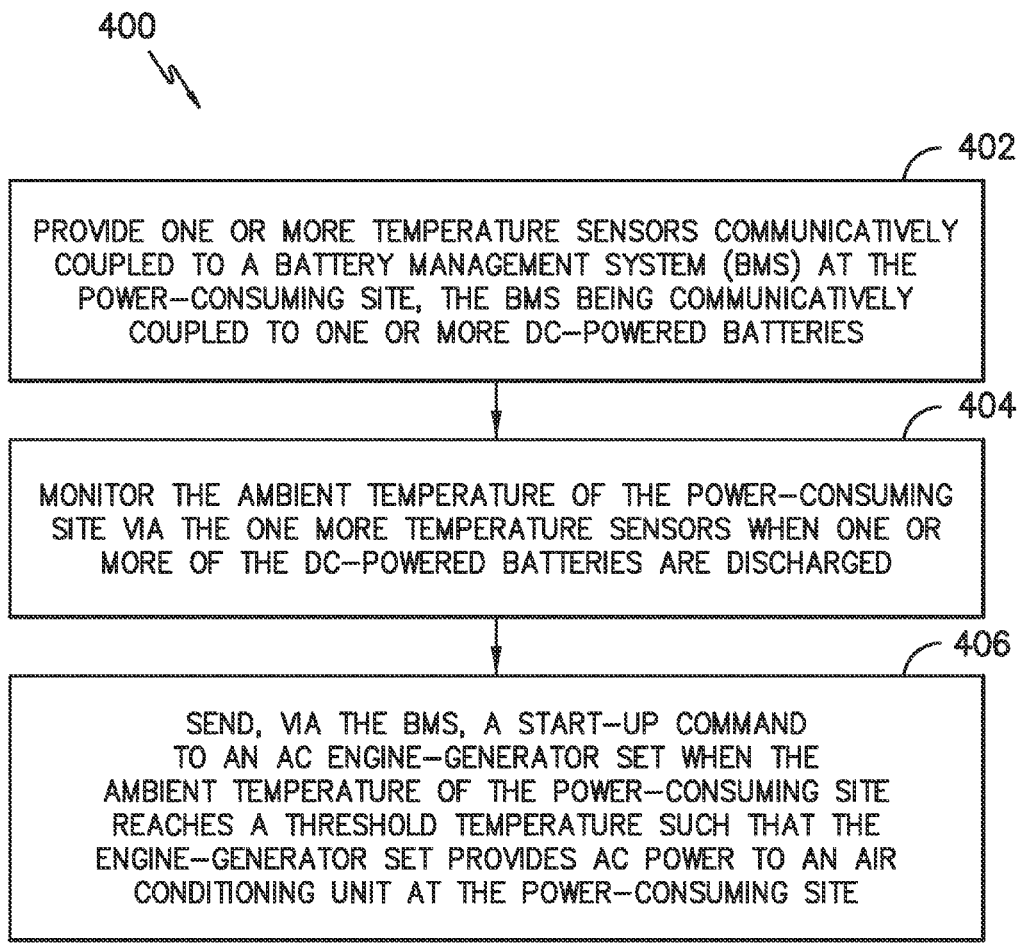
FIG. -4-

SYSTEM AND METHOD FOR CONTROLLING AMBIENT TEMPERATURE AT A POWER-CONSUMING SITE

FIELD OF THE INVENTION

The present disclosure relates generally to hybrid generator-battery systems, and more particular to a system and method for controlling ambient temperature at a power-consuming site, e.g. a telecommunications facility, having a hybrid generator-battery system.

BACKGROUND OF THE INVENTION

Typically, the primary source of electrical power for a consuming entity, e.g. a telecommunications facility, is commercial power from a utility. However, for an off-grid or weak-grid telecom facility, the main power source may include an engine-generator set, such as a diesel generator, and a battery power source that can be used in backup situations. For example, if power from the commercial utility is lost, the diesel generator can be activated to supply power to the telecom facility. Start-up of the diesel generator, however, takes time; therefore, the battery power source provides power during this transitional time period. If the diesel generator fails to start (e.g., runs out of fuel, suffers a mechanical failure), then the battery power source is able to provide power for an additional period of time. Though diesel generators are inexpensive to install, the escalating cost of diesel fuel, and its delivery to remote locations, has driven the search for alternative, economical solutions.

For example, certain telecom facilities employ a diesel-battery hybrid power system to conserve fuel where the primary power source is a diesel generator. In such a scenario, a long, life-cycle battery is used to alternately share the site load with the diesel generator. More specifically, during operation, the diesel generator is modulated on and off and, when it is active, powers the facility and recharges the battery at an overall higher efficiency than if powering the facility alone. Once the battery is recharged, the generator can be turned off and the battery is used to sustain the facility load. Such hybrid power systems may also include a battery management system configured to monitor and control the battery.

Generally, telecom facilities include both direct current (DC) and alternating current (AC) loads. Typical AC loads at the site include, for example, the site air conditioning unit and lighting. The air conditioning unit maintains the site ambient temperature so as to ensure various equipment of the site operates with predetermined design limits. More specifically, the air conditioning unit is typically controlled via a separate controller having an internal thermostat. During operation, when the diesel generator is on and the battery is charging, the internal thermostat of the air conditioning unit controls operation of the unit to maintain the ambient temperature with predetermined limits. When the diesel generator is off and the battery is discharging, normal thermal loading from equipment at the site and/or from solar loading can increase the ambient temperature at the installed location (usually a small indoor shelter). During this time, once the temperature reaches a threshold temperature, the AC-powered air conditioning unit cannot turn on unless a DC-AC inverter is included in the power system because the diesel generator is off and the battery is DC-powered. Such an inverter, however, is typically very expensive and complex to install.

Accordingly, it would be advantageous to provide an improved system and method for controlling ambient temperature at a power-consuming site without installing an inverter.

BRIEF DESCRIPTION OF THE INVENTION

Aspects and advantages of the invention will be set forth in part in the following description, or may be obvious from the description, or may be learned through practice of the invention.

One example aspect of the present disclosure is directed to a method for controlling ambient temperature at a power-consuming site having a hybrid generator-battery power system. The hybrid generator-battery power system generally includes an AC engine-generator set, e.g. a diesel generator, and one or more DC-powered batteries that alternately share the site load. The method includes providing one or more temperature sensors communicatively coupled to a battery management system at the power-consuming site. Another step includes monitoring the ambient temperature of the power-consuming site via the one or more temperature sensors when one or more of the DC-powered batteries are discharging (i.e. when the engine-generator set is off). The method also includes sending, via the battery management system, a start-up command to an AC engine-generator set when the ambient temperature of the power-consuming site reaches a threshold temperature such that the engine-generator set can provide AC power to an air conditioning unit at the power-consuming site.

In another aspect, the present disclosure is directed to a method for controlling an AC engine-generator set located at a power-consuming site. As mentioned, the hybrid generator-battery power system generally includes an AC engine-generator set and one or more DC-powered batteries. The method includes providing one or more temperature sensors communicatively coupled to a battery management system at the power-consuming site. Another step includes monitoring an ambient temperature of the power-consuming site via the one or more temperature sensors when one or more of the DC-powered batteries are discharging. A next step includes sending, via the battery management system, a start-up command to the AC engine-generator set when the ambient temperature of the power system site reaches a threshold temperature such that the engine-generator set can provide power to one or more AC-powered components of the power-consuming site.

In still another aspect, the present disclosure is directed to a system for controlling ambient temperature at a power-consuming site having a generator-battery hybrid power system. The system includes at least one temperature sensor and a battery management system configured to monitor and/or control at least one DC-powered battery. The temperature sensor is configured to monitor the ambient temperature of the power-consuming site when the DC-powered battery is discharging (e.g. when the engine-generator set is off). The battery management system is further configured to send a start-up command to an AC engine-generator set when the ambient temperature of the power-consuming site reaches a threshold temperature such that the engine-generator set can provide AC power to an air conditioning unit at the power-consuming site.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 illustrates a schematic diagram of one embodiment of a hybrid generator-battery power system for a telecommunications application according to conventional construction;

FIG. 2 illustrates a block diagram of one embodiment of a battery management system (BMS) according to the present disclosure;

FIG. 3 illustrates a schematic diagram of one embodiment of a system for controlling ambient temperature at a power-consuming site having a generator-battery hybrid power system according to the present disclosure; and FIG. 4 illustrates one embodiment of a flow diagram of an example method for controlling ambient temperature at a power-consuming site having a generator-battery hybrid power system according to the present disclosure.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents Generally, the present disclosure is directed to a system and method for controlling ambient temperature at a power-consuming site, e.g. a telecommunications facility, having a hybrid generator-battery power system. More specifically, the generator-battery hybrid power system includes an engine-generator set (EGS), e.g. a diesel generator, a battery power source, and a battery management system (BMS). During operation, when the EGS is on and the battery power source is charging, the internal thermostat of the air conditioning unit located at the site controls the unit to maintain the ambient temperature within predetermined limits. When the EGS is off and the battery power source is discharging, however, the system of the present disclosure utilizes one or more calibrated temperatures sensors communicatively coupled to the BMS to monitor the ambient temperature of the site. In addition, the BMS is configured to send a start-up command to the EGS when the temperature sensors detect that the ambient temperature of the power-consuming site is above a threshold temperature such that the engine-generator set can provide AC power to the air conditioning unit so as to control the ambient temperature.

The present disclosure has many advantages not present in the prior art. For example, the present disclosure is capable of controlling the site air conditioning unit so as to maintain ambient temperature within predetermined operational bounds without the need to install an inverter or a separate EGS controller. Thus, site installation costs and complexity are effectively reduced.

Referring now to the drawings, FIG. 1 is an illustration of a hybrid generator-battery power system 150 for a typical telecom base transceiver station (BTS) according to conventional construction. As shown, the illustrated embodiment depicts multiple sources of power including an AC power grid 110, an engine-generator power source or engine-generator set (EGS) 120 and a battery power source 140, which is an energy storage device (ESD). A transfer switch 115 allows transfer of operation between the AC grid power and the EGS 120, as well as other AC electrical power that may be available. The EGS 120 typically runs on fuel (e.g., diesel fuel) provided by a fuel source 125 (e.g., a storage tank). An availability switch 135 allows for alternate energy sources 130 (e.g. solar, wind, or fuel cell), if available, to be switched in to a DC bus 145 or an AC bus 155 of the power system 100 as well. If switching into the AC bus 155, an inverter 170 (described below) can be coupled between the alternate energy source 130 and the AC bus 155.

The battery power source 140 is an electrical power source. More specifically, in certain embodiments, the battery power source 140 may include one or more sodium nickel chloride batteries 142. Such batteries are particularly suitable due to their short charge times that can drive the EGS 120 to peak efficiency, thereby reducing fuel costs for the BTS. In addition, battery performance is not affected by ambient temperature; therefore, such batteries can be used at sites with extreme temperature variations.

The AC bus 155 provides AC power to drive AC loads 160 of the power system 150 such as, for example, lighting and/or air conditioning of the BTS. Furthermore, the AC bus 155 typically provides AC power to a rectifier 170 which converts AC power to DC power and provides the DC power to the DC bus 145 to drive DC loads 180 of the power system 150 such as the radios, switches, and amplifiers of the BTS. The DC bus 145 also provides DC power from the rectifier 170 to charge the battery power source 140 and provides DC power from the battery power source 140 to the DC loads 180 as the battery power source 140 discharges. A controller 190 may be configured to monitor and/or control various aspects of the power system 150, such as commanding the engine of the EGS 120 to turn on or off in accordance with a control logic of the controller 190. In accordance with various embodiments, the controller 190 may be a separate unit or may be part of a battery management system (BMS) 144 of the battery power source 140.

The rectifier or regulator 170 may regulate DC power from a DC electrical power source (e.g., a solar energy system or a fuel cell energy system) instead of an AC electrical power source. The terms "rectifier" and "regulator" are used broadly herein to describe a device that conditions energy from a primary power source to provide DC electrical power to DC loads (e.g., DC loads 180) and to an ESD (e.g., the battery power source 140). In general, a primary power source may provide AC or DC electrical power that is used by an ESD (e.g., by the DC battery power source 140) of the power system 150.

During operation of the power system 150 of FIG. 1, when the EGS 120 is on, the EGS 120 provides power to the AC and DC loads 160, 180 and to the battery power source 140 during a charging part of the cycle. When the EGS 120 is off, the battery power source 140 provides power to the AC and DC loads 160, 180 during a discharging part of the cycle. The state of the battery power source 140 can be estimated by observations of the current of the battery power source 140. More specifically, the series or recharge resistance profile is learned or otherwise determined as a function of charge status. This characteristic is then monitored and updated as the battery power source 140 ages.

Still referring to FIG. 1, the battery power source 140 is typically controlled by the BMS 144. The BMS 144, as referred to herein, generally refers to any electronic system that manages the battery power source 140. For example, in several embodiments, the BMS 144 is configured to monitor and/or control operation of the batteries 142. More specifically, the BMS 144 may be configured to protect the batteries 142 from operating outside of safe operation, monitor their state, calculate and report data, control the battery environment, and/or any other suitable control actions needed for battery protection.

In addition, the BMS 144 may be, for example, a logic controller implemented purely in hardware, a firmware-programmable digital signal processor, or a programmable processor-based software-controlled computer. More particularly, as shown in FIG. 2, the BMS 144 can include any number of control devices. As shown, for example, the BMS 144 can include one or more processor(s) 172 and associated memory device(s) 174 configured to perform a variety of computer-implemented functions and/or instructions (e.g., performing the methods, steps, calculations and the like and storing relevant data as disclosed herein). The instructions when executed by the processor 172 can cause the processor 172 to perform operations, including providing control commands to the battery power source 140, the ESD 120, and/or other aspects of the power system 150. Additionally, the BMS 144 may also include a communications module 176 to facilitate communications between the BMS 144 and the various components of the power system 150. Further, the communications module 176 may include a sensor interface 178 (e.g., one or more analog-to-digital converters) to permit signals transmitted from one or more sensors within the power system 150 to be converted into signals that can be understood and processed by the processors 172. It should be appreciated that the sensors (e.g. temperature sensors 126, 128) may be communicatively coupled to the communications module 176 using any suitable means. For example, as shown in FIG. 2, the sensors 126, 128 are coupled to the sensor interface 178 via a wired connection. However, in other embodiments, the sensors 126, 128 may be coupled to the sensor interface 178 via a wireless connection, such as by using any suitable wireless communications protocol known in the art. As such, the processor 172 may be configured to receive one or more signals from the sensors 126, 128.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 172 is also configured to compute advanced control algorithms and communicate to a variety of Ethernet or serial-based protocols (Modbus, OPC, CAN, etc.). Additionally, the memory device(s) 174 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 174 may generally be configured to store suitable computer-readable instructions that, when implemented by the processor(s) 172, configure the BMS 144 to perform the various functions as described herein.

Referring now to FIG. 3, a simplified schematic diagram of one embodiment of a system 100 for controlling ambient temperature at a power-consuming site is illustrated according to the present disclosure. As shown, the system 100 includes one or more temperature sensors 126, 128 communicatively coupled with the BMS 144. Though the sensors 126, 128 are shown within the BMS 144, it should be understood that the sensors 126, 128 may also be located at any other suitable location within the system 100 so as to accurately detect the ambient temperature of the site.

In the illustrated embodiment, upon commissioning and installation of the battery power source 140, the system 100 determines a local temperature of the BMS 144 and compares that local temperature with the ambient temperature of the power-consuming site to determine a temperature offset. The temperature offset is input into the BMS 144 software to account for any differences between the local BMS temperature and the true ambient temperature of the installation at the power-consuming site. Based on the temperature offset, the system 100 can then calibrate the temperature sensors 126, 128 before the system 100 is operated. Thus, the temperature sensors 126, 128 are configured to monitor any suitable temperature parameter of the system 100 (e.g. the ambient temperature). More specifically, the temperature sensors 126, 128 are configured to monitor the ambient temperature of the power-consuming site when one or more of the batteries 142 of the BMS 142 are discharging (i.e. when the EGS 120 is off). In addition, it should be understood that the temperature sensors 126, 128 may also be re-calibrated after a predetermined time period or at any other suitable time during operation of the system 100.

As mentioned, when the EGS 120 is on and the battery power source 140 is charging, the internal thermostat of the air conditioning unit 162 controls the unit. When the EGS 120 is off and the battery power source 140 is discharging, however, normal thermal loading from other one or more components of the system 100 and/or from solar loading can increase the local ambient temperature at the installed location (e.g. typically a small indoor shelter). In the conventional configuration (as shown in FIG. 1), once the temperature reaches a threshold temperature the air conditioning unit 162 cannot turn on without the inverter 170 as no AC power would otherwise be available because the EGS 120 is off.

In the present disclosure (as shown in FIG. 2), however, the temperature sensors 126, 128 are configured to continuously monitor the ambient temperature at the site. Thus, when the sensors 126, 128 detect that the ambient temperature is above the threshold temperature, the sensors 126, 128 are configured to send a signal to the BMS 144. The BMS 144 then sends a start-up command to the EGS 120 to turn on, e.g. through BMS output relay or a modbus command, so as to provide AC power to the air conditioning unit 162, which is configured to reduce the ambient temperature such that it is lower than the threshold temperature. In certain embodiments, the temperature sensors 126, 128 may continue monitoring the ambient temperature after the air conditioning unit 162 turns so as to detect when the ambient temperature returns to an acceptable range. Thus, the BMS 144 is also configured to send a shut-off command to the EGS 120 so as to stop power provided to the air conditioning unit 162 when the ambient temperature is acceptable.

Referring now to FIG. 4, a flow diagram of one embodiment of a method 400 for controlling ambient temperature at a power-consuming site having a generator-battery hybrid power system is illustrated according to the present disclosure. As mentioned, the hybrid generator-battery power system generally includes an AC engine-generator set and one or more DC-powered batteries that alternately share the site load. In addition, the DC-powered batteries are controlled by a battery management system. At (402), the method 400 includes providing one or more temperature sensors communicatively coupled to the battery management system at the power-consuming site. At (404), the method includes monitoring the ambient temperature of the power-consuming site via the one or more temperature sensors when one or more of the DC-powered batteries are discharging. At (406), the method includes sending, via the battery management system, a start-up command to an AC engine-generator set when the ambient temperature of the power-consuming site reaches a threshold temperature such that the engine-generator set can provide AC power to an air conditioning unit at the power-consuming site.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for controlling ambient temperature at a power-consuming site having a generator-battery hybrid power system, the method comprising:
    alternating power supply to the power-consuming site between an alternating current (AC) engine-generator set and one or more direct current (DC)-powered batteries;
    providing one or more temperature sensors communicatively coupled to a battery management system at the power-consuming site, the battery management system comprises at least one processor and is communicatively coupled with one or more DC-powered batteries so as to provide control of the one or more DC-powered batteries;
    monitoring the ambient temperature of the power-consuming site via the one or more temperature sensors when one or more of the DC-powered batteries are discharging and the AC engine-generator set is off; and,
    sending, via the battery management system, a start-up command to the AC engine-generator set when the one or more of the DC-powered batteries are discharging and the monitored ambient temperature of the power-consuming site when the engine-generator set is off reaches a threshold temperature such that the AC engine-generator set provides AC power to an air conditioning unit at the power-consuming site.

2. The method of claim 1, further comprising:
    determining a local temperature of the battery management system;
    determining a temperature offset between the local temperature of the battery management system and the ambient temperature of the power-consuming site; and
    calibrating the one or more temperature sensors to account for the temperature offset.

3. The method of claim 2, further comprising re-calibrating one or more of the temperature sensors after a predetermined time period.

4. The method of claim 1, further comprising monitoring the ambient temperature after sending the start-up command to the engine-generator set and sending a shut-down command to the engine-generator set when the ambient temperature is below the threshold temperature.

5. The method of claim 1, further comprising monitoring the ambient temperature of the power-consuming site via an internal thermostat of the air conditioning unit when one or more of the DC-powered batteries are charging.

6. The method of claim 1, wherein the power-consuming site comprises a telecommunications facility.

7. The method of claim 1, wherein the engine-generator set comprises a diesel generator.

8. A method for controlling an alternating current (AC) engine-generator set located at a power-consuming site, the method comprising:
    providing one or more temperature sensors within a battery management system at the power-consuming site, the battery management system comprising at least one processor and being communicatively coupled with one or more direct current (DC) powered batteries so as to provide control of the one or more DC-powered batteries;
    monitoring an ambient temperature of the power-consuming site via the one or more temperature sensors when the one or more of the DC-powered batteries are discharging and the AC engine-generator set is off; and,
    sending, via the battery management system, a start-up command to the AC engine-generator set when the one or more of the DC-powered batteries are discharging and the monitored ambient temperature of the power-consuming site when the engine-generator set is off reaches a threshold temperature such that the AC engine-generator set provides power to one or more AC-powered components of the power-consuming site.

9. The method of claim 8, further comprising:
    determining a local temperature of the battery management system;
    determining a temperature offset between the local temperature of the battery management system and the ambient temperature of the power-consuming site; and
    calibrating the one or more temperature sensors to account for the temperature offset.

10. The method of claim 9, further comprising re-calibrating one or more of the temperature sensors after a predetermined time period.

11. The method of claim 8, further comprising monitoring the ambient temperature after sending the start-up command to the engine-generator set and sending a shut-down command to the engine-generator set when the ambient temperature is below the threshold temperature.

12. The method of claim 8, further comprising monitoring the ambient temperature of the power-consuming site via an internal thermostat of the air conditioning unit when one or more of the DC-powered batteries are charging.

13. The method of claim 8, wherein the one or more AC-powered components comprises an air conditioning unit.

14. The method of claim 8, wherein the power-consuming site comprises a telecommunications facility.

15. The method of claim 8, wherein the engine-generator set comprises a diesel generator.

16. A system for controlling ambient temperature at a power-consuming site having a generator-battery hybrid power system, the system comprising:
- a battery power source comprising a battery management system and at least one direct current (DC) powered battery, the battery management system comprising at least one processor; and
- at least one temperature sensor communicatively coupled to the battery management system, the temperature sensor configured to monitor the ambient temperature of the power-consuming site when the at least one DC-powered battery is discharging and the engine-generator set is off,
- wherein the processor of the battery management system is configured to send a start-up command to an alternating current (AC) engine-generator set when the at least one DC-powered battery is discharging and the monitored ambient temperature of the power-consuming site when the engine-generator set is off reaches a threshold temperature such that the AC engine-generator set provides AC power to an air conditioning unit at the power-consuming site.

* * * * *